United States Patent [19]

Dominek et al.

[11] Patent Number: 4,809,003
[45] Date of Patent: Feb. 28, 1989

[54] ALMOND TEST BODY

[75] Inventors: Allen K. Dominek, Columbus, Ohio; Melvin C. Gilreath, Hampton; Richard M. Wood, Virginia Beach, both of Va.

[73] Assignee: The United States of America as represented by the Administrator of the National Aeronautics and Space Administration, Washington, D.C.

[21] Appl. No.: 197,191

[22] Filed: May 23, 1988

[51] Int. Cl.[4] .................................................. G01S 7/40
[52] U.S. Cl. ........................................ 342/165; 342/1; 342/5
[58] Field of Search ...................... 73/866.4; 343/703; 342/1, 2, 5, 165, 360

[56] References Cited

U.S. PATENT DOCUMENTS 4,713,667 12/1987 Poirer et al. ..................... 342/1 X

OTHER PUBLICATIONS

D. R. Rhodes, "Radar Echo Measurements Using Models", Radio-Electronic Engineering, Apr. 1954, pp. 19–21.

Primary Examiner—T. H. Tubbesing
Assistant Examiner—Gilberto Barrón, Jr.
Attorney, Agent, or Firm—George F. Helfrich; John R. Manning; Charles E. B. Glenn

[57] ABSTRACT

An almond shaped radar cross-section test body for use in microwave anechoic chambers, which exhibits a large dynamic scattered field over large angular regions.

1 Claim, 1 Drawing Sheet

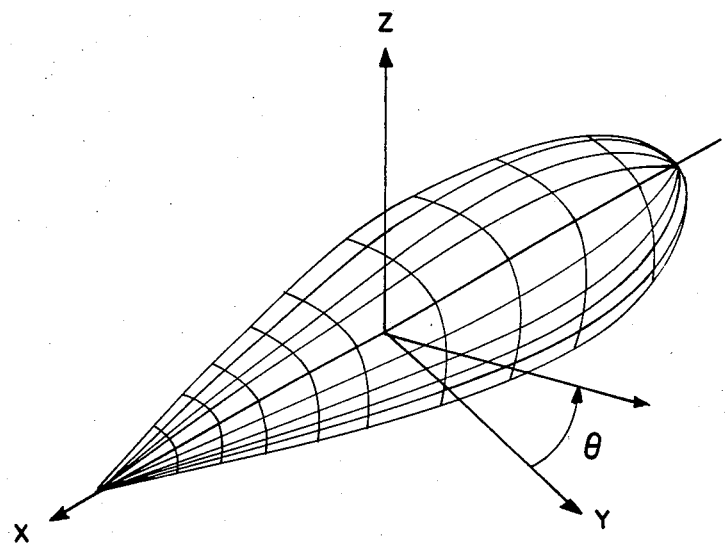

4,809,003

ALMOND TEST BODY

ORIGIN OF THE INVENTION

The invention described herein was jointly made by employees of the U.S. States Government and contract employees in the performance of work under a NASA contract and is subject to the provisions of Public Law 96-517 (35 USC 202) in which the contractor has elected not to retain title.

BACKGROUND OF THE INVENTION

1. Field of the Invention

The invention relates to the field of measuring and testing and more particularly to a radar cross-section test body.

2. Description of the Prior Art

There are two applications for this invention. One is as a test body to examine the measurement performance of a microwave anechoic chamber and the other is to support components so that their radar cross-section can be measured.

A microwave anechoic chamber should have the capability to measure the scattered fields from an object over a very large dynamic range, especially for very low fields. The chamber should be evaluated before any measurements can be trusted. In the past, a spherical test body has been used, which has good bistatic scattering characteristics, but the return is very large. Hence, some other means is required to test the performance for low level signals. Another canonical shape, the ogive, has a very low backscattered return for very near axial incidence. However, another canonical shape is desired that has a very low return over a very broad angular region, to truly verify the performance of the chamber. The almond test body has the desirable characteristic of producing a large dynamic scattered field over large angular regions.

To be useful as a component mount, a test body should exhibit a low return so that it does not perturb the measurement of the component, and the test body should simulate the backscatter characteristics of the component as if over an infinite ground plane.

OBJECTS AND SUMMARY

It is an object of the invention to provide a test body suitable for verifying performance characteristics of microwave anechoic chambers.

It is a further object of the invention to provide a test body which does not perturb the measured response of components mounted upon it.

A further object of the invention is to provide a test body that simulates the backscatter characteristics of mounted components as if the component was over an infinite ground plane.

The invention is a test body for use in microwave anechoic chambers, which, because of its approximately almond shape, shall be referred to as an almond test body. Because the almond test body exhibits a large dynamic scattered field over large angular regions, it is particularly suitable for verifying the performance of microwave anechoic chambers.

The almond test body can also be used as a surface upon which to mount components to measure their radar cross-section. The advantage of the almond test body is that it has a very low return that does not perturb the measurement of the desired response. This test body also has the desirable feature of simulating the backscatter characteristics of the component as if the component was over an infinite ground plane.

Other objects and advantages of this invention will become apparent hereinafter in the specification and drawings which follow.

DESCRIPTION OF THE DRAWINGS

FIG. 1 depicts the axes system used in describing the almond test body of the present invention.

DESCRIPTION OF THE INVENTION

Test bodies are used in radar cross-section (RCS) measurement facilities for evaluating the performance achievable for a given facility and for measuring the RCS of components.

Equations (1–4) completely define the surface of the almond test body in terms of the constants $A_1$, $A_2$, $B_1$, $B_2$, $R_1$ and $R_2$ according to the axes system described in FIG. 1. Equations (1) and (2) define the surface for $x \geq 0.0$;

For $x \geq 0$ $$Y = A_1[(1-(x/R_1)^2)^{\frac{1}{2}} - \cos \alpha] \cos \theta \quad (1)$$

$$Z = B_1[(1-(x/R_1)^2)^{\frac{1}{2}} - \cos \alpha] \sin \theta \quad (2)$$

Equations (3) and (4) define the surface for $x \leq 0.0$;

$$Y = A_2[(1-(x/R_2)^2)^{\frac{1}{2}}] \cos \theta \quad (3)$$

$$Z = B_2[(1-(x/R_2)^2)^{\frac{1}{2}}] \sin \theta \quad (4)$$

where, $$0° \leq \theta \leq 360°$$

and where the constants L, $R_1$, $R_2$ $A_1$, $A_2$, $B_1$ and $B_2$ satisfy $$L = R_2 + \sin \alpha_1 R_1 \quad (5)$$

$$1 = R_1^2/R_2^2(1 - \cos \alpha_1) \quad (6)$$

where, $$0.0 < \alpha_1 < 90° \quad (7)$$

$$A_1 = R_1^2/R_2^2 A_2 \quad (8)$$

$$B_1 = R_1^2/R_2^2 B_2 \quad (9)$$

where, $$2 \leq A_2/B_2 \leq 20 \quad (10)$$

L = total body length; and
$R_2$ = rear portion body length (blunt end).

As is known to those skilled in the art, the useful size of a test body depends on the frequency range contemplated for the specification application; hence no overall length is given.

Of course, the axes system described in FIG. 1 is only for purposes of defining the shape of the almond test body; once built, the almond test body can be oriented horizontally, vertically or at any orientation, depending on the application.

The almond test body surface is a composite formed by joining properly scaled ellipsoidal type surfaces together. As is known to those skilled in the art, the test body can be fabricated by a number of methods, including a wooden model, or an epoxy-fiberglass coating over a high density foam understructure. The scattering performance is controlled by three main factors. First, the low backscatter return ($< -55$ dB/m$^2$ above 6 GHz for a 1 meter long body) is obtained by having a sharp tip with a small cone angle to eliminate any specular return over a large angular region. The only returns are due to tip and creeping wave diffractions, which are low level returns. Secondly, opposite of the tip end of the test body is a smoothly curved termination that gently sheds the energy off. Shedding the energy off in this manner, unlike the ogive surface when there are sharp tips at both ends and energy scatters strongly off the rear tip, gives the desired performance. Thirdly, the body is continuous and smooth over the whole body up to the second derivative except for the tip. This eliminates any large diffraction centers that would raise the whole body return.

What is claimed as new and desired to be secured by Letters Patent of the U.S. is:

1. An almond test body comprising:
the family of surface analytically defined by:

$$Y = A_1[(1-(x/R_1)^2)^{\frac{1}{2}} - \cos \alpha] \cos \theta$$

$$Z = B_1[(1-(x/R_1)^2)^{\frac{1}{2}} - \cos \alpha] \sin \theta$$

cross-sections for $x \geq 0$;

$$Y = A_2[(1-(x/R_2)^2)^{\frac{1}{2}}] \cos \theta$$

$$Z = B_2[(1-(x/R_2)^2)^{\frac{1}{2}}] \sin \theta$$

cross-sections for $x \leq 0$
where, $$0° \leq \theta \leq 360°$$

and, where the constants L, $R_1$, $R_2$, $A_1$, $A_2$, $B_1$ and $B_2$ satisfy $$L = R_2 + \sin \alpha_1 R_1$$

$$1 = R_1^2/R_2^2(1-\cos \alpha_1)$$

where, $$0.0 < \alpha_1 < 90°$$

$$A_1 = R_1^2/R_2^2 A_2$$

$$B_1 = R_1^2/R_2^2 B_2$$

where, $$2 \leq A_2/B_2 \leq 20$$

L = total body length; and
$R_2$ = rear portion body length (blunt end).

* * * * *